(12) United States Patent
Chakravarti et al.

(10) Patent No.: US 6,500,772 B2
(45) Date of Patent: Dec. 31, 2002

(54) METHODS AND MATERIALS FOR DEPOSITING FILMS ON SEMICONDUCTOR SUBSTRATES

(75) Inventors: Ashima B. Chakravarti, Hopewell Junction, NY (US); Richard A. Conti, Mount Kisco, NY (US); Chester Dziobkowski, Hopewell Junction, NY (US); Thomas Ivers, Hopewell Junction, NY (US); Paul Jamison, Hopewell Junction, NY (US); Frank Liucci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,072

(22) Filed: Jan. 8, 2001

(65) Prior Publication Data

US 2002/0090835 A1 Jul. 11, 2002

(51) Int. Cl.$^7$ .................. H01L 21/31; H01L 21/469
(52) U.S. Cl. .................. 438/789; 438/790; 438/793; 438/794
(58) Field of Search .................. 438/787, 788, 438/789, 790, 791, 793, 794

(56) References Cited

U.S. PATENT DOCUMENTS

| 5,486,589 A | | 1/1996 | Inoue | |
|---|---|---|---|---|
| 5,874,368 A | | 2/1999 | Laxman et al. | |
| 5,926,689 A | | 7/1999 | Cote et al. | |
| 5,976,991 A | * | 11/1999 | Laxman et al. | 438/786 |
| 6,030,881 A | * | 2/2000 | Papasouliotis et al. | 438/424 |
| 6,117,345 A | * | 9/2000 | Liu et al. | 216/9 |
| 6,153,261 A | * | 11/2000 | Xia et al. | 427/255.393 |

\* cited by examiner

Primary Examiner—Alexander Ghyka
(74) Attorney, Agent, or Firm—Steven Capella

(57) ABSTRACT

A method of depositing a film on a substrate, comprising placing the substrate in the presence of plasma energy, and contacting the substrate with a reactive gas component comprising a compound of the formula $(R-NH)_{4-n}SiX_n$, wherein R is an alkyl group, n is 1, 2, or 3, and X is selected from hydrogen or the halogens. The reactive gas composition may further comprise an oxidizer and/or a reducing agent.

8 Claims, 2 Drawing Sheets

METHODS AND MATERIALS FOR DEPOSITING FILMS ON SEMICONDUCTOR SUBSTRATES

FIELD OF THE INVENTION

This invention relates to processes and materials for the formation of films on semiconductor substrates, and in particular to chemical vapor deposition processes and materials for the formation of such films.

BACKGROUND OF THE INVENTION

The manufacture of semiconductor devices often requires the deposition of thin dielectric films upon semiconductor wafers. The most commonly used process is chemical vapor deposition (CVD), using silane, disilane, or tetraethyl orthosilicate precursors for the formation of silicon-based films. Precursors for silicon nitride films in particular include tertiary amines, mixtures of dichlorosilane with ammonia, mixtures of silane with ammonia, and mixtures of diethylsilane with ammonia. Oxynitrides can be obtained by addition of nitrous or nitric oxide. These methods suffer from various drawbacks, such as high hydrogen content in the deposited films, use of chlorosilane precursors (which results in the formation and deposition of ammonium chloride), and use of pyrophoric gases. U.S. Pat. Nos. 5,874,368 and 5,976,991 to Laxman et al. disclose a process for the low pressure chemical vapor deposition (LPCVD) of silicon dioxide or silicon nitride films using bis(tert-butylamino) silane. However, LPCVD is disadvantageous in that it generally requires high furnace temperatures exceeding 500° C. Higher furnace temperatures can be incompatible with other steps of the semiconductor manufacturing process such as middle and back end of line (MOL and BEOL) processing.

Alternatives to LPCVD include plasma-enhanced chemical vapor deposition (PECVD) and high density plasma chemical vapor deposition (HDPCVD), both of which may be executed at temperatures less than about 500° C. With silane precursors, however, these processes can result in less than complete sidewall and/or bottom step coverage, particularly for high aspect ratio gap fill applications. There accordingly remains a need in the art for improved chemical vapor deposition precursors and processes for silicon nitride and oxide films that operate at lower temperature and that provide films with improved properties and improved coverage.

SUMMARY OF THE INVENTION

A method for depositing a silicon nitride or oxynitride film on a semiconductor substrate comprises placing the substrate in the presence of plasma energy, and contacting the substrate with a reactive gas composition comprising nitrogen-containing compounds of the formula (R—NH)$_2$SiX$_2$. The temperature of the substrate may be maintained at less than about 500° C.

An alternative preferred embodiment comprises placing a semiconductor substrate in the presence of high density plasma energy; and contacting the substrate with a reactive component comprising bis(tert-butylamino)silane and other optional reactants, optionally at a substrate temperature of less than about 450° C. The method results in higher-quality films that are compatible with lower temperature processing requirements.

DETAILED DESCRIPTION OF THE INVENTION

High quality, silicon oxide and nitride films may be formed by plasma-mediated chemical vapor deposition using nitrogen-containing compounds of the formula (R—NH)$_2$SiX$_2$. This method is particularly suited for use in plasma-enhanced chemical vapor deposition (PECVD) and high density plasma chemical vapor deposition (HDPCVD) processes. The substrate may be heated or unheated, i.e., the plasma energy may or may not be supplemented with thermal energy.

A variety of substrates are suitable for deposition, including but not limited to semiconductors such as silicon, and especially silicon wafers.

The silicon and nitrogen-containing compound has the formula $$(R-NH)_{4-n}SiX_n \qquad (I)$$

wherein R is an alkyl group having 1 to about 12, and preferably 2 to 4 carbon atoms, or an aryl group having from 6 to about 18 carbon atoms, n is 1, 2, or 3, preferably 2, and X is either hydrogen or a halogen. The alkyl or aryl groups may further comprise substituents such as alkyl, aryl, halo, hydroxy, alkoxy, amino, or other groups, as long as such groups do not interfere with deposition. Suitable halogens include fluorine, chlorine, bromine, and iodine, with fluorine preferred. An especially preferred nitrogen-containing compound is bis(tert-butylamino) silane (BTBAS), having the structure:

$$\{(CH_3)_3CNH\}_2SiH_2 \qquad (II)$$

Figure 1:
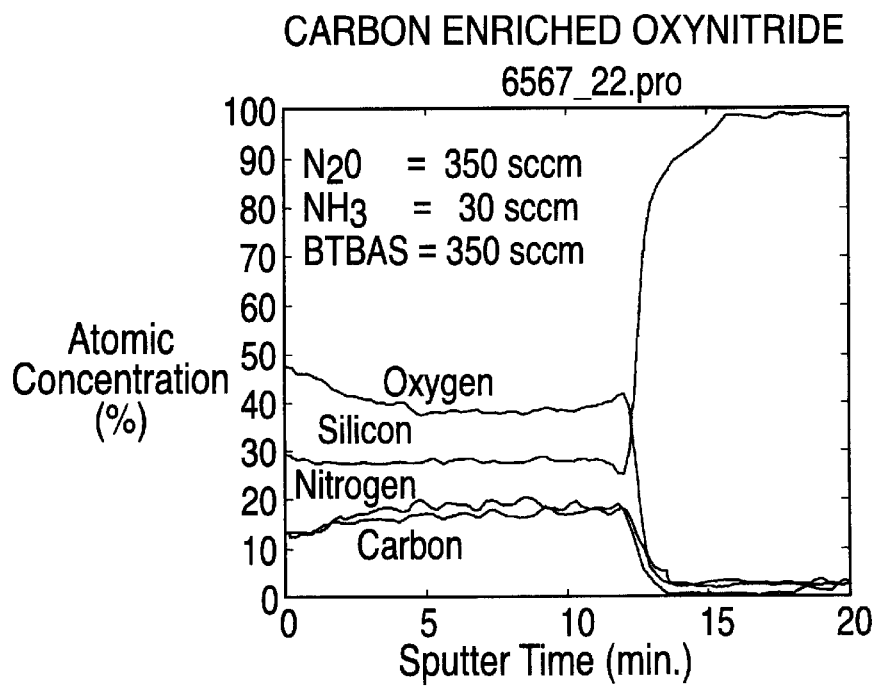
FIG. 1 shows the atomic concentrations of a carbon-enriched silicon oxynitride film deposited from BTBAS, ammonia, and nitrous oxide using PECVD.
Figure 2:
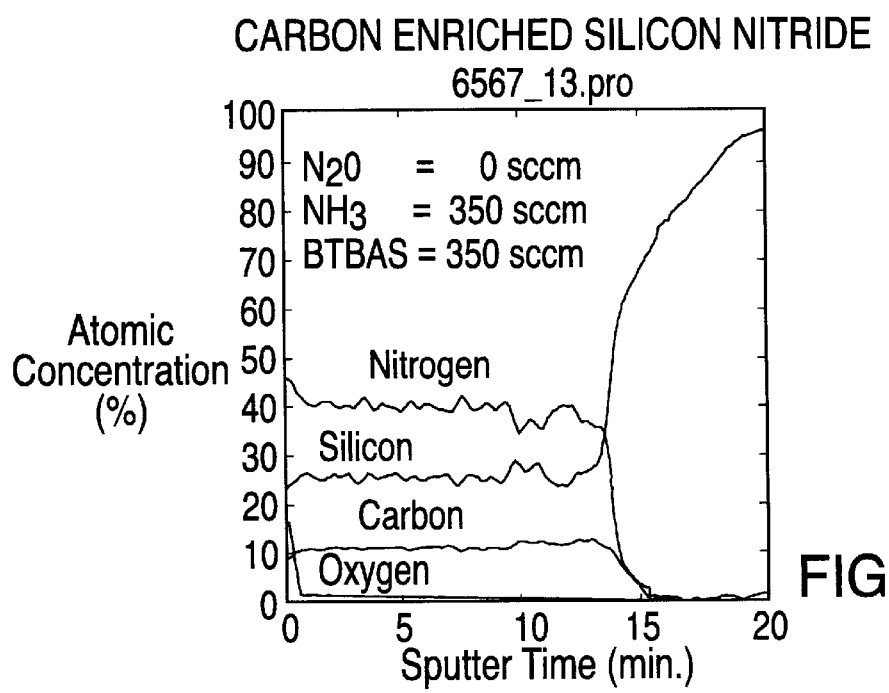
FIG. 2 shows the atomic concentrations of a carbon-enriched silicon nitride film deposited from BTBAS and ammonia using PECVD.
Figure 3:
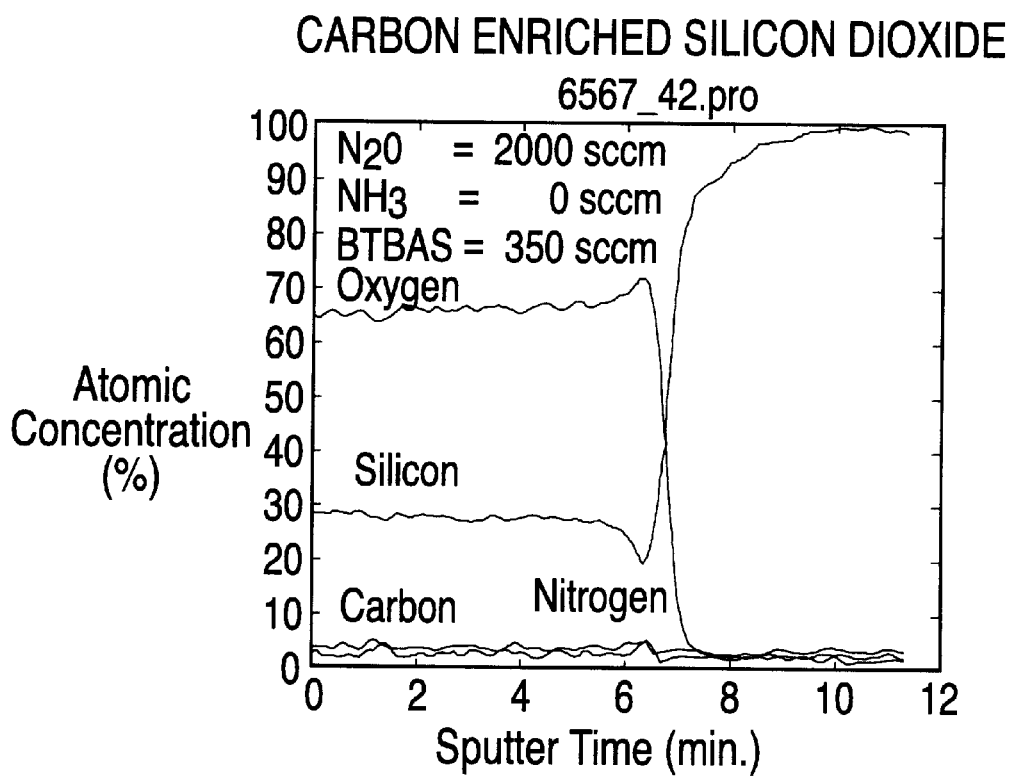
FIG. 3 shows the atomic concentrations of a carbon-enriched silicon dioxide film deposited from BTBAS and nitrous oxide using PECVD.

The reactive gas composition may additionally comprise other components known in the art, for example inert gases such as nitrogen, argon, or helium; oxidizing gases such as oxygen, ozone, nitrous oxide (N$_2$O), nitric oxide (NO), nitrogen dioxide (NO$_2$), and carbon dioxide; and reducing gases such as NH$_3$, and the like. The particular identity of the reactive gas composition determines the compositions of the films. For example, carbon-enriched silicon oxynitride films are deposited from BTBAS, ammonia, and nitrous oxide as shown in FIG. 1; carbon-enriched silicon nitride films are deposited from BTBAS and ammonia as shown in FIG. 2; and carbon-enriched silicon dioxide films are deposited from BTBAS and nitrous oxide as shown in FIG. 3. FIGS. 1, 2, and 3 are Auger data calibrated from Rutherford backscattering spectrometry, wherein hydrogen is not shown. The composition of the films may be described as SiC$_x$O$_y$H$_z$ and SiC$_x$O$_y$H$_z$N$_1$.

The relative amounts of carbon in the final film may be controlled by varying the ratio of NH$_3$ and oxidizer to BTBAS. Low levels of carbon in silicon oxide, nitride, and oxynitride are useful in contact etch (RIE) stop applications. Incorporation of higher levels of carbon is useful in the manufacture of lower dielectric constant nitride and oxide layers suitable for replacing Si$_3$N$_4$ or SiO$_2$. Higher levels of carbon incorporation may also be used to prepare hardmask materials used during pattern transfer to oxide films.

Boron- and phosphorus-containing precursors may also be present in the reactive gas composition, thereby providing phosphosilicate, borosilicate, and borophosphosilicate films, as well as boron nitrides. Exemplary boron and phosphorus precursors include but are not limited to diborane ($B_2H_6$), triethyl borate (TEB), trimethyl borate(TMB), phosphine ($PH_3$), triethyl phosphate (TEPO), trimethylphosphite (TMPi), and the like, as well as combinations comprising at least one of the foregoing.

Arsenic and germanium containing precursors may also be present in the reactive gas composition, thereby providing arsenosilicates or gernanosilicates or arsenogermanosilicates. Exemplary arsenic and germanium precursors include but are not limited to arsine ($AsH_3$), trimethyl arsine, tertiary butyl arsine, $GeH_4$, trimethyl germane, tertiary butyl germane, tetramethylorthogermanium (TMOGe), or tetraethylorthogermanium (TEOGe), as well as combinations comprising at least one of the foregoing.

Effective relative quantities of $(R-NH)_2SiX_2$ in the reactive gas composition are readily determined by one of ordinary skill in the art, and will vary depending on factors including but not limited to the identity of the other components, the thickness of the desired film, the temperature of the deposition, and the particular plasma-mediated deposition method. In general, $(R-NH)_2SiX_2$ carried in helium is present in the reactive gas composition in an amount from about 1% to about 20%, and most preferably about 10% to about 20%. Silicon nitride films are obtained by deposition in the presence of ammonia, whereas silicon oxynitride films are obtained by deposition in the presence of ammonia and nitrous oxide. Where ammonia is used, the molar ratio of ammonia to BTBAS is generally greater than about 2:1, and preferably greater than about 3.5:1. Additional helium may be added beyond that used as the carrier for BTBAS.

Substrate temperatures during deposition may be below about 550° C., or below about 500° C., and provide, in combination the plasma energy effective deposition of high quality coatings. Substrate temperatures are in the range from about 200 to about 550° C., usually about 350 to about 450° C. The pressure during deposition is maintained below about 20 Torr preferably about 1–8 Torr.

As mentioned above, plasma-mediated deposition may be conducted with or without additional thermal energy, and results in higher quality coatings that are more economical. One suitable deposition method is known generally as PECVD, wherein silicon films are deposited on a semiconductor substrate, such as a wafer, by bringing the reactive composition into contact with the substrate in the presence of plasma. The plasma may be energized by electromagnetic radiation such as that in the radio frequency (RF) spectrum or other forms of energy suited to the intended purpose, or a combination comprising at least one of the foregoing types of energy.

Typically, the reaction will be carried out as a batch or single wafer process wherein the substrate is placed in a plasma deposition chamber having a plurality of electrodes driven by an RF source with the substrate in conductive contact with at least one electrode. Gases are introduced into the chamber to be ionized to a plasma. The RF source will typically have an RMS power of from about 50 milliwatts per square centimeter ($mW/cm^2$) to about 5 Watts per square centimeter ($W/Cm^2$), typically riding on a 0 to 100 volt DC bias, usually a 5 to 50 volt DC bias, and more usually a 10 to 15 volt bias, with respect to the substrate. This will generally provide enough energy to ionize the gases in the chamber to create a plasma. One or more of the electrodes typically comprises a sprayhead to introduce the gases and facilitate their ionization. There may be both a low frequency (LF) and high frequency (HF) component to the energy signal.

Suitable PECVD plasma deposition chambers for conducting batch processes are known in the art, and are commercially available, for example from Applied Materials under the designation Precision 5000. Variations on the above methods are available, such as that described in commonly assigned U.S. Pat. No. 5,926,689, issued Jul. 20, 1999.

High density plasma chemical vapor deposition (HDPCVD) may also be used for deposition of silicon nitride films from $(R-NH)_2SiX_2$ components. In this process, a film is deposited on a semiconductor substrate by bringing the substrate in contact with the reactive composition in the presence of a high density plasma. High density plasmas are typically produced by inductively coupling the energy source to the plasma gas. This typically results in higher plasma densities than that found in PECVD methods and much higher energy particle collisions on the semiconductor surface.

Typically, the semiconductor substrate will be run in a single wafer process. The chamber will typically be evacuated to between 1 to 100 milli Torr and preferably to about 10 milliTorr, and inductively coupled RF power supplied, typically in the range of from about 0.1 to about 10 kilowatts, preferably about 2 to about 10 kilowatts. There may be both a low frequency (LF) and high frequency (HF) component to the energy signal.

Suitable HDPCVD plasma deposition chambers for conducting batch processes are known in the art, and are commercially available, for example Novellus Systems of San Jose, Calif. under the designation SPEED. Variations on the above methods are available, such as that described in U.S. Pat. No. 6,117,345, issued Sep. 12, 2000.

The deposition of the film may be conducted in a single step or may be accomplished in a multistep process such as that described in commonly assigned U.S. Pat. No. 6,030,881, issued Feb. 29, 2000, entitled "High Throughput Chemical Vapor Deposition Process Capable of Filling High Aspect Ratio Structures".

Use of bis(tert-butylamino)silane is advantageous because unlike silane, it is not pyrophoric. Good step coverage usually requires higher processing temperatures, but with the present method, lower processing temperatures can be used to obtain better step coverage.

The invention is further illustrated by the following non-limiting Example.

EXAMPLE

About 100 to 500 standard cubic centimeters (sccm) of helium is bubbled through liquid bis(tert-butylamino)silane and delivered to a process chamber containing a silicon substrate heated to 420° C. and maintained at a pressure or 5.25 torr. Ammonia (30 to 150 sccm) and nitrous oxide (350 to 2000 sccm) are also introduced into the process chamber, while applying 250 to 700 Watts (13.56 megahertz) power to the sprayhead electrode for 30 to 60 seconds, resulting in the deposition of films about 500 to about 3000 Angstroms thick. The film may contain about 10 to about 20 atomic percent of nitrogen, about 10 to about 20 atomic percent of carbon, about 40 atomic percent of oxygen, and about 20 to about 30 atomic percent of silicon.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims. All patents and other cited references are incorporated herein by reference.

What is claimed is:

1. A method of depositing a film on a substrate, comprising:

placing the substrate in the presence of a high density plasma;

contacting the substrate with a reactive gas component comprising a nitrogen-containing compound of the formula:

$$(R-NH)_{4-n}SiX_n$$

wherein R is an alkyl group having 1 to about 12 carbon atoms or an aryl group having from 6 to about 18 carbon atoms, n is 1, 2, or 3, and X is either hydrogen or a halogen, wherein said substrate is maintained at a temperature of about 350 to about 450° C. during deposition.

2. The method of claim 1, wherein R is an alkyl group having from two to four carbon atoms and X is hydrogen.

3. The method of claim 1, wherein the nitrogen-containing compound is bis(tert-butylamino)silane.

4. The method of claim 1, wherein the reactive gas composition further comprises one or more of an inert carrier gas, an oxidizing gas, or a reducing gas.

5. The method of claim 1, wherein the reactive gas component further comprises nitrogen, argon, helium, oxygen, ozone, nitrous oxide, nitric oxide, nitrogen dioxide, carbon dioxide, ammonia, or a combination comprising at least one of the foregoing gases.

6. The method of claim 1 wherein said reactive component further comprises a dopant.

7. The method of claim 1, wherein the reactive component further comprises a boron-containing precursor, a phosphorous-containing precursor, an arsenic-containing precursor, a germanium-containing precursor, or a combination comprising at least one of the foregoing precursors.

8. The method of claim 1, wherein the reactive component further comprises diborane, triethyl borate, trimethyl borate, phosphine, triethyl phosphate, trimethylphosphite, arsine, trimethyl arsine, tertiary butyl arsine, $GeH_4$, trimethyl germane, tertiary butyl germane, tetramethylorthogermanium, tetraethylorthogermanium, or a mixture comprising at least one of the foregoing.

\* \* \* \* \*